(12) United States Patent
Uetani

(10) Patent No.: US 8,268,193 B2
(45) Date of Patent: Sep. 18, 2012

(54) POLYMER COMPOSITION FOR ORGANIC ELECTROLUMINESCENCE

(75) Inventor: Yasunori Uetani, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 543 days.

(21) Appl. No.: 11/912,681

(22) PCT Filed: May 17, 2006

(86) PCT No.: PCT/JP2006/309823
§ 371 (c)(1),
(2), (4) Date: Oct. 26, 2007

(87) PCT Pub. No.: WO2006/123696
PCT Pub. Date: Nov. 23, 2006

(65) Prior Publication Data
US 2009/0302278 A1    Dec. 10, 2009

(30) Foreign Application Priority Data

May 17, 2005    (JP) .................................. 2005-143820

(51) Int. Cl.
H01B 1/00 (2006.01)
H01L 51/00 (2006.01)
C08G 73/00 (2006.01)
H01J 1/62 (2006.01)
C09K 11/06 (2006.01)

(52) U.S. Cl. ..................... 252/500; 252/301.16; 257/40; 528/422; 313/504

(58) Field of Classification Search .................. 252/500, 252/301.16; 257/40; 528/422; 313/504
See application file for complete search history.

(56) References Cited

U.S. PATENT DOCUMENTS

| 5,552,216 | A | * | 9/1996 | Sugimoto et al. | ............. 428/328 |
| 5,962,148 | A | * | 10/1999 | Nishimura et al. | ........... 428/522 |
| 6,024,895 | A | | 2/2000 | Shimizu et al. | |
| 6,107,452 | A | | 8/2000 | Miller et al. | |
| 6,372,154 | B1 | | 4/2002 | Li | |
| 6,597,012 | B2 | * | 7/2003 | Kido et al. | ...................... 257/40 |
| 2002/0106529 | A1 | | 8/2002 | Okunaka | |
| 2003/0077437 | A1 | | 4/2003 | Nakamura et al. | |
| 2005/0186106 | A1 | | 8/2005 | Li et al. | |
| 2006/0022193 | A1 | * | 2/2006 | Williamson et al. | ............ 257/40 |
| 2009/0039765 | A1 | * | 2/2009 | Uetani et al. | ................. 313/504 |

FOREIGN PATENT DOCUMENTS

| EP | 0300376 A1 | 1/1989 |
| JP | 2003-73666 A | 3/2003 |
| JP | 2005-243300 A | 9/2005 |
| WO | WO 96/20253 A1 | 7/1996 |
| WO | WO 97/07167 A1 | 2/1997 |
| WO | WO 02/10129 A2 | 2/2002 |
| WO | 02/21611 A1 | 3/2002 |
| WO | WO 2004/100282 A2 | 11/2004 |
| WO | 2005/027583 A1 | 3/2005 |
| WO | WO 2006/025290 | * 3/2006 |

OTHER PUBLICATIONS

Office Action issued in Japanese Patent Application No. 2006-136026, dated Jun. 13, 2012.

* cited by examiner

*Primary Examiner* — Mark Kopec
*Assistant Examiner* — Jaison Thomas
(74) *Attorney, Agent, or Firm* — Sughrue Mion, PLLC

(57) ABSTRACT

A polymer material as light emitter or charge transport material, and a polymer composition for organic electroluminescence containing a crosslinking agent characterized in that the crosslinking agent has no aromatic ring.

17 Claims, No Drawings

POLYMER COMPOSITION FOR ORGANIC ELECTROLUMINESCENCE

TECHNICAL FIELD

The present invention relates to a polymer composition for organic electroluminescence.

BACKGROUND ART

Organic electroluminescence devices (organic EL devices) are a generic term of devices using organic compounds as a light emission material of a light emission layer and a charge transport material. In manufacture of organic EL devices, a method in which a solution of a polymer materials is wet-coated is excellent in productivity to a method in which a low molecule is vapor-deposited.

However, when a laminate structure is fabricated by wet-coating, there is a problem that a layer coated earlier dissolves in a solvent contained in a layer coated later and a laminate structure cannot be fabricated. Therefore, methods in which a layer is made solvent-insoluble by crosslinking the layer are proposed.

One of the methods involves that a crosslinking group is synthetically bonded to a polymer compound itself having light emissiveness and charge transportability (see Patent Documents 1 to 3). However, as in these prior art documents, a synthetic process is complicate to synthetically bond a crosslinking group to a polymer compound itself having light emissiveness and charge transportability.

Patent Documents 4 and 5 involve that a low molecular compound having light emissiveness and charge transportability is mixed with a polymer compound having a crosslinking group, and that a polymer compound having light emissiveness and charge transportability is mixed with a polymer compound having a crosslinking group or a low molecular compound having a crosslinking group represented by an aromatic bis-azide, as a crosslinking agent. However, if a crosslinking agent having a crosslinking group has an aromatic ring, the light emissiveness and charge transportability which a light emission material and a charge transport material have by nature may be adversely affected.

As methods other than crosslinking, there is a method in which solutions of different polarities are used for adjacent layers. For example, a method is commonly used in polymer organic EL, in which method a water-soluble PEDOT:PSS is used for a hole injection layer so that the layer does not dissolve even if an oil-soluble light emission layer is applied for an upper layer. However, obtained devices do not have a sufficient performance.

Patent Document 6 discloses an organic EL device provided with a first organic layer and a second organic layer, characterized in that the first organic layer contains a polymer having carrier transportability and light emissiveness and a low molecular crosslinking agent having functional groups, and the low molecular crosslinking agent is crosslinked in the first organic layer. However, the low molecular crosslinking agent having two to four functional groups is used and the method has problems in curability of the organic layer and easiness of fabrication of the layer structure.

Patent Document 1: U.S. Pat. No. 6,107,452
Patent Document 2: US2002/106529 (JP-A-2002-170667)
Patent Document 3: WO96/20253 (JP-A-10-511718)
Patent Document 4: WO2002/10129 (JP-A-2004-505169)
Patent Document 5: WO2004/100282
Patent Document 6: US2005/0186106A1

DISCLOSURE OF THE INVENTION

Problems to be Solved by the Invention

It is an object of the present invention to provide a polymer composition for organic EL whereby a layer structure can be fabricated easily and organic EL devices excellent in device performances such as efficiency can be provided.

That is, the present invention provides a polymer composition for organic electroluminescence containing a polymer material as a charge transport material or light emitter and a crosslinking agent, and the polymer composition characterized by the crosslinking agent having no aromatic ring.

Further, the present invention relates to an organic electroluminescence device fabricated using the polymer composition.

Advantages of the Invention

The polymer composition of the present invention can easily form a layer structure and provide an organic EL device excellent in device performances. The organic EL device fabricated using the polymer composition can be used favorably for apparatuses such as curved or planar light sources as a backlight or illumination of liquid crystal displays, display devices of segment type and flat panel displays of dot matrix.

BEST MODE FOR CARRYING OUT THE INVENTION

The polymer composition of the present invention is characterized by containing a polymer material as a charge transport material or light emitter (hereinafter, also referred to as polymer charge transport material or polymer light emitter, respectively) and further containing a crosslinking agent having no aromatic ring.

The crosslinking agent denotes a monomer compound having a substituent which is polymerizable by the action of heat, light, a thermal polymerization initiator or a photopolymerization initiator. The polymerizable substituent (crosslinking group) represents a substituent which can form an intermolecular bond of two or more molecules by causing a polymerization reaction to produce a compound. The crosslinking agent used in the present invention has no aromatic ring, and therefore, the crosslinking group has no aromatic ring.

Such crosslinking groups include, for example, a vinyl group, an acetylene group, a butenyl group, an acryl group, an acrylate group, an acrylamide group, a methacryl group, a methacrylate group, a methacrylamide group, a vinyl ether group, a vinylamino group, a silanol group, groups having a small-membered ring (for example, a cyclopropyl group, a cyclobutyl group, an epoxy group, an oxetane group, a diketene group and an episulfide group), a lactone group, a lactam group and groups having a structure of a siloxane derivative.

Other than the above-mentioned groups, combinations of groups capable of forming an ester bond and an amide bond and others can be utilized. The examples are combinations of an ester group and an amino group, and an ester group and a hydroxyl group.

As a crosslinking agent, particularly polyfunctional monomers of bi- or more functional monomers (monomers having two or more crosslinking groups), preferably penta- or more functional monomers (monomers having five or more crosslinking groups) are excellent in curability and preferably used.

As a crosslinking agent, particularly monomers having a (meth)acrylate group as a crosslinking group (namely, (meth) acrylates; (meth)acrylates are a generic term of acrylates and methacrylates.) are preferable, and (meth)acrylates of an aliphatic alcohol are more preferable. Specific examples of monofunctional monomers having a (meth)acrylate group include 2-ethylhexylcarbitol acrylate and 2-hydroxyethyl acrylate; and specific examples of bifunctional monomers having (meth)acrylate groups include 1,6-hexanediol di(meth)acrylate, ethylene glycol di(meth)acrylate, neopentyl glycol di(meth)acrylate, triethylene glycol di(meth)acrylate and 3-methylpentanediol di(meth)acrylate. Specific other examples of polyfunctional monomers having (meth) acrylate groups include trifunctional (meth)acrylates such as trimethylolpropane tri(meth)acrylate and pentaerythritol tri(meth)acrylate, tetrafunctional (meth)acrylates such as pentaerythritol tetra(meth)acrylate, pentafunctional (meth)acrylates such as dipentaerythritol penta(meth)acrylate, and hexa- or more functional (meth)acrylates such as dipentaerythritol hexa(meth)acrylate and trispentaerythritol octa(meth)acrylate. Particularly bi- or more functional (meth)acrylates, preferably penta- or more functional (meth)acrylates, more preferably dipentaerythritol penta- or hexa-acrylate or tripentaerythritol octaacrylate, further preferably dipentaerythritol hexaacrylate or tripentaerythritol octaacrylate, are excellent in curability and preferably used. Crosslinking agents are described, for example, in p. 17 to p. 56 of Photopolymer Handbook (in Japanese) (Kogyo Chosakai Publishing, Inc. (Japan), 1989).

A crosslinking agent is contained, based on 100 mass % of a total of a polymer charge transport material or a polymer light emitter, in the range of generally 1 to 99 mass %, preferably 1 to 60 mass %, and more preferably 5 to 50 mass %. The content of a crosslinking agent in the range of 1 to 60 mass % with respect to the above described basis has a tendency of providing a coating film with a favorable smoothness, which is preferable.

These crosslinking agents may be used singly or in a combination of two or more.

The polymer composition of the present invention may contain a photopolymerization initiator. The photopolymerization initiator includes active radical generating agents which generate active radicals by irradiation of light, and acid generating agents which generate acids thereby. For example, active radical generating agents include acetophenone photopolymerization initiators, benzoin photopolymerization initiators, benzophenone photopolymerization initiators, thioxanthone photopolymerization initiators and triazine photopolymerization initiators.

There is a case where a polymer charge transport material or polymer light emitter itself generates radicals by light and functions as a photopolymerization initiator. Such a case can dispense with addition of a photopolymerization initiator.

Acetophenone photopolymerization initiators include, for example, diethoxyacetophenone, 2-hydroxy-2-methyl-1-phenylpropan-1-one, benzyl dimethyl ketal, 2-hydroxy-2-methyl-1-[4-(2-hydroxyethoxy)phenyl]propan-1-one, 1-hydroxycyclohexyl phenyl ketone, 2-methyl-2-morpholino-1-(4-methylthiophenyl)propan-1-one, 2-benzyl-2-dimethylamino-1-(4-morpholinophenyl)butan-1-one and an oligomer of 2-hydroxy-2-methyl-1-[4-(1-methylvinyl)phenyl]propan-1-one.

Benzoin photopolymerization initiators include, for example, benzoin, benzoin methyl ether, benzoin ethyl ether, benzoin isopropyl ether and benzoin isobutyl ether. Benzophenone photopolymerization initiators include, for example, benzophenone, methyl o-benzoylbenzoate, 4-phenylbenzophenone, 4-benzoyl-4'-methyldiphenylsulfide, 3,3', 4,4'-tetra(tert-butylperoxycarbonyl)benzophenone and 2,4, 6-trimethylbenzophenone.

Thioxanthone photopolymerization initiators include, for example, 2-isopropylthioxanthone, 4-isopropylthioxanthone, 2,4-diethylthioxanthone, 2,4-dichlorothioxanthone and 1-chloro-4-propoxythioxanthone.

Triazine photopolymerization initiators include, for example, 2,4-bis(trichloromethyl)-6-(4-methoxyphenyl)-1, 3,5-triazine, 2,4-bis(trichloromethyl)-6-(4-methoxynaphthyl)-1,3,5-triazine, 2,4-bis(trichloromethyl)-6-piperonyl-1, 3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine and 2,4-bis(trichloromethyl)-6-[2-(3,4-dimethoxyphenyl)ethenyl]-1,3,5-triazine.

As an active radical generating agent, for example, 2,4,6-trimethylbenzoyldiphenylphosphine oxide, 2,2'-bis(o-chlorophenyl)-4,4',5,5'-tetraphenyl-1,2'-biimidazole, 10-butyl-2-chloroacridone, 2-ethylanthraquinone, benzyl, 9,10-phenanthrenequinone, camphorquinone, methyl phenylglyoxylate and titanocene compounds can be used. As an active radical generating agent, those commercially available can also be used. A commercially available photopolymerization initiator includes, for example, trade name: Irgacure-907 (an acetophenone photopolymerization initiator, Chiba-Geigy Corp.).

Acid generating agents include, for example, onium salts such as 4-hydroxyphenyldimethylsulfonium p-toluenesulfonate, 4-hydroxyphenyldimethylsulfonium hexafluoroantimonate, 4-acetoxyphenyldimethylsulfonium p-toluenesulfonate, 4-acetoxyphenyl methyl benzylsulfonium hexafluoroantimonate, triphenylsulfonium p-toluenesulfonate, triphenylsulfonium hexafluoroantimonate, diphenyliodonium p-toluenesulfonate and diphenyliodonium hexafluoroantimonate, nitrobenzyltosylates, and benzointosylates.

Among the above-mentioned compounds as an active radical generating agent, there are some compounds to generate an acid simultaneously with an active radical; for example, triazine photopolymerization initiators are used also as an acid generating agent.

These photopolymerization initiators may be used singly or in a combination of two or more.

The polymer composition of the present invention may contain a photopolymerization initiation auxiliary agent. The photopolymerization initiation auxiliary agent is a compound used for promoting the polymerization of a crosslinking agent which has been initiated by a photopolymerization initiator. Photopolymerization initiation auxiliary agents include, for example, aminic ones and alkoxyanthracene ones.

Aminic photopolymerization initiation auxiliary agents include, for example, triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl 4-dimethylaminobenzoate, N,N-dimethylparatoluidine, 4,4'-bis(dimethylamino)benzophenone (commonly called Michler's ketone), 4,4'-bis(diethylamino)benzophenone and 4,4'-bis(ethylmethylamino)benzophenone.

Alkoxyanthracene photopolymerization initiation auxiliary agents include, for example, 9,10-dimethoxyanthracene, 2-ethyl-9,10-dimethoxyanthracene, 9,10-diethoxyanthracene and 2-ethyl-9,10-diethoxyanthracene. Commercially available photopolymerization initiation auxiliary agents can be used and include, for example, trade name: EAB-F (Hodogaya Chemical Co., Ltd.).

When such a photopolymerization initiation auxiliary agent is used, the content thereof is generally not more than 10 mol, preferably not less than 0.01 mol and not more than 5 mol to one mole of a photopolymerization initiator. The total amount of a photopolymerization initiator and a photopolymerization initiation auxiliary agent is generally not less than 3 parts by mass and not more than 30 parts by mass, preferably not less than 5 parts by mass and not more than 25 parts by mass to 100 parts by mass of the total amount of crosslinking agents.

The polymer composition of the present invention may further contain a chain-transfer agent. Chain-transfer agents include 2,4-diphenyl-4-methyl-1-pentene, n-dodecylmercaptane, t-dodecylmercaptane, n-octylmercaptan and limonene. The content of such a chain-transfer agent is generally not less than 0.5% and not more than 5% by weight fraction to the total solid content of a composition of the present invention.

The polymer composition of the present invention may contain a thermal polymerization initiator. Thermal polymerization initiators generally known as radical polymerization initiators can be used, and include, for example, azo compounds such as 2,2'-azobisisobutyronitrile, 2,2'-azobis-(2,4-dimethylvaleronitrile) and 2,2'-azobis-(4-methoxy-2,4-dimethylvaleronitrile), organic peroxides such as benzoyl peroxide, lauroyl peroxide, t-butylperoxypivalate and 1,1'-bis-(t-butylperoxy)cyclohexane, and hydrogen peroxide. When a peroxide is used as a radical polymerization initiator, the peroxide may be made a redox type initiator by using it together with a reducing agent.

Then, a polymer light emitter used in the present invention will be described.

A polymer light emitter used in the present invention generally has a number-averaged molecular weight of $10^3$ to $10^8$ in terms of polystyrene. Among polymer light emitters, a conjugated polymer compound is preferable. Herein, a conjugated polymer compound means a polymer compound along whose main chain skeleton delocalized π electron pairs exist. As the delocalized electrons, unpaired electrons or lone electron pairs may join the resonance instead of double bonds.

A polymer light emitter used in the present invention may be a homopolymer or a copolymer, and includes, for example, a polyfluorene (see, for example, Jpn. J. Appl. Phys., vol. 30, L1941 (1991)), a polyparaphenylene (see, for example, Adv. Master. Vol. 4, 36 (1992)), a polyarylene polymer such as polypyrrole, polypyridine, polyaniline and polythiophene, a polyarylene vinylene polymer such as polyparaphenylene vinylene and polythienylene vinylene (see, for example, WO98/27136 laid-open specification), a polyphenylene sulfide, and a polycarbazole (see, as general remarks, for example, Advanced Materials Vol. 12, 1737-1750 (2000), and Organic EL Display Technology, Monthly Display, a special number for Dec., p. 68 to p. 73).

Among them, polyarylene polymer light emitters are preferable.

Repeating units contained in polyarylene polymer light emitters include an arylene group and a bivalent heterocyclic group, and the polyarylene polymer light emitters contain preferably 20 to 100 mol % of these repeating units, further preferably 50 to 99 mol % thereof.

Herein, the number of carbons constituting a ring of an arylene group is generally about 6 to 60. Specific examples thereof include a phenylene group, a biphenylene group, a terphenylene group, a naphthalenediyl group, an anthracenediyl group, a phenanthrenediyl group, a pentalenediyl group, an indenediyl group, a heptalenediyl group, an indacenediyl group, a triphenylenediyl group, a binaphthyldiyl group, a phenylnaphthylenediyl group, a stilbenediyl group and fluorenediyl (for example, in the chemical formula (1) below, a case of A=—C(R')(R')—).

The number of carbons constituting a ring of a bivalent heterocyclic group is generally about 3 to 60. Specific examples thereof include a pyridinediyl group, a diazaphenylene group, a quinolinediyl group, a quinoxalinediyl group, an acridinediyl group, a bipirydyldiyl group, a phenanthronediyl group and a case where, in the chemical formula (1) below, A=—O—, —S—, —Se—, —NR''—, C(R')(R')— or —Si(R')(R')—).

Further preferably, polyarylene polymer light emitters contain a repeating unit shown in the following formula (1).

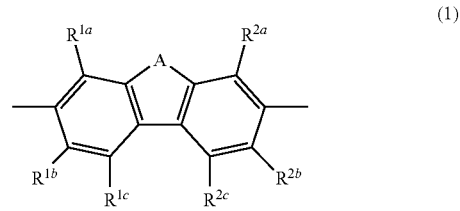

(1)

(wherein, A denotes an atom or an atom group that completes a five-membered ring or a six-membered ring together with four carbon atoms on the two benzene rings in the chemical formula; $R^{1a}$, $R^{1b}$, $R^{1c}$, $R^{2a}$, $R^{2b}$ and $R^{2c}$ each independently denotes a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group or a carboxyl group; and $R^{1b}$ and $R^{1c}$, and $R^{2b}$ and $R^{2c}$ may form a ring together, respectively.)

A denotes an atom or an atom group that completes a five-membered ring or a six-membered ring together with four carbon atoms on the two benzene rings in the chemical formula (1), and is exemplified by the following, but is not limited thereto.

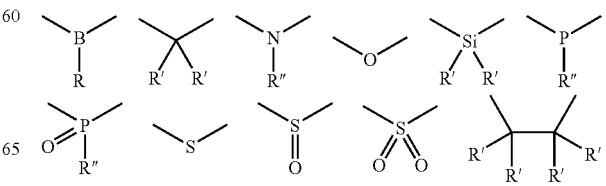

-continued

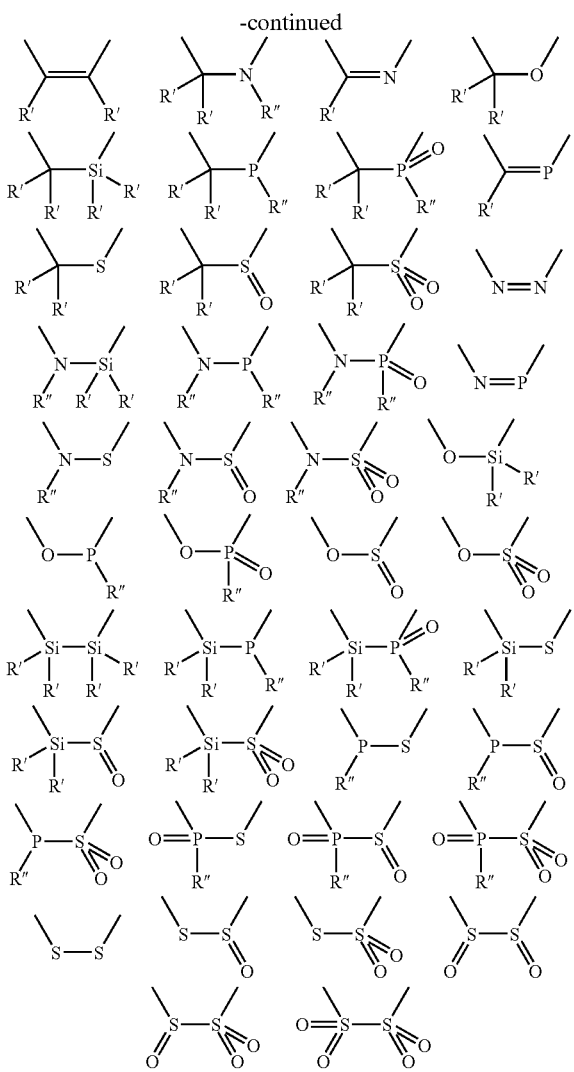

wherein, R, R' and R" each independently denotes a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyloxy group, a substituted amino group, a substituted silyloxy group, a substituted silylthio group, a substituted silylamino group, a cyano group or a monovalent heterocyclic group; R' independently denotes a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group or a monovalent heterocyclic group; and R" independently denotes a hydrogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, a substituted silyl group, a substituted silyloxy group, a substituted silylthio group, a substituted silylamino group or a monovalent heterocyclic group.

Definitions and specific examples of a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, a substituted silyloxy group, a substituted silylthio group, a substituted silylamino group, a substituted amino group, an amide group, an acid imide group, an acyl group, an acyloxy group and a monovalent heterocyclic group in R, R' and R", are the same as described in the above-mentioned $R^{1a}$, $R^{1b}$, $R^{1c}$, $R^{2a}$, $R^{2b}$ and $R^{2c}$.

A is preferably —O—, —S—, —Se—, —NR"—, —CR'R'— or —SiR'R'—, more preferably —O—, —S— or —CR'R'—.

A halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group and a heteroaryloxycarbonyl group in $R^{1a}$, $R^{1b}$, $R^{1c}$, $R^{2a}$, $R^{2b}$ and $R^{2c}$ are the same described above.

A repeating unit shown in the chemical formula (1) above is exemplified by the following structures.

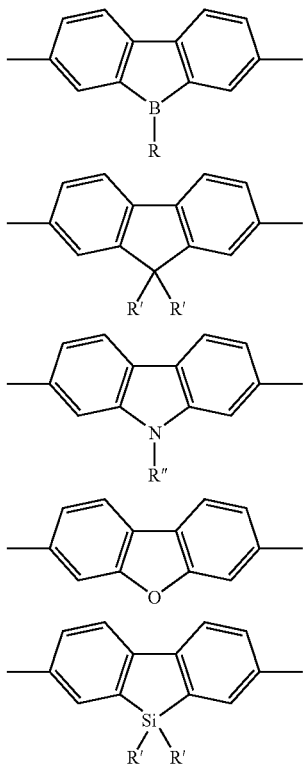

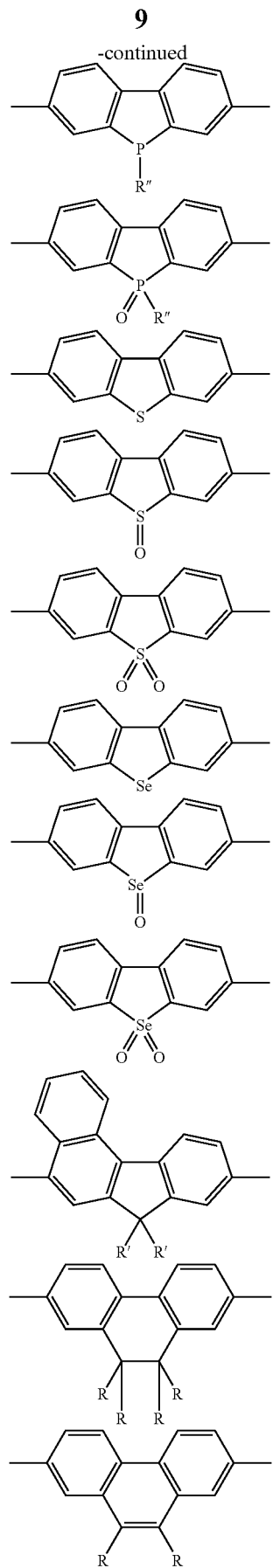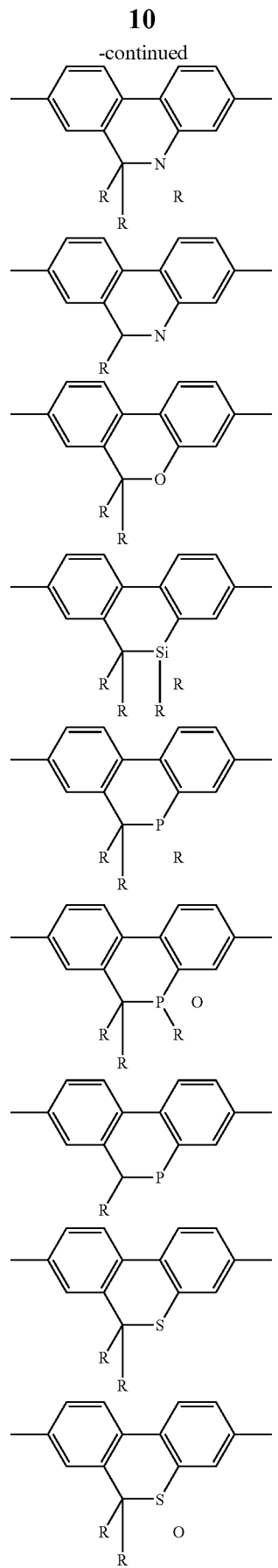

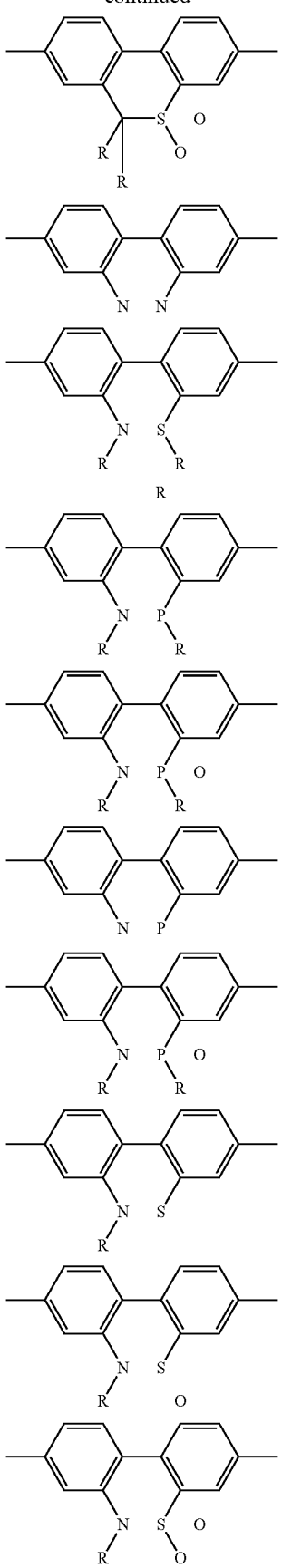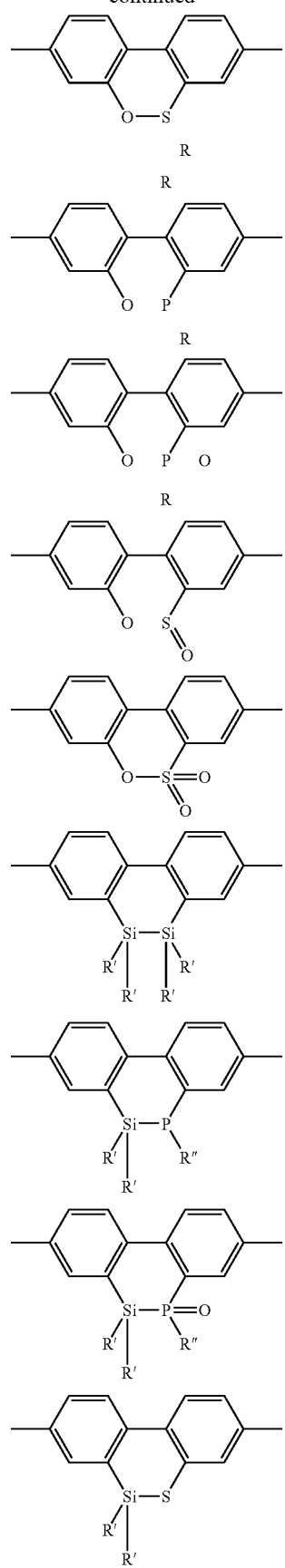

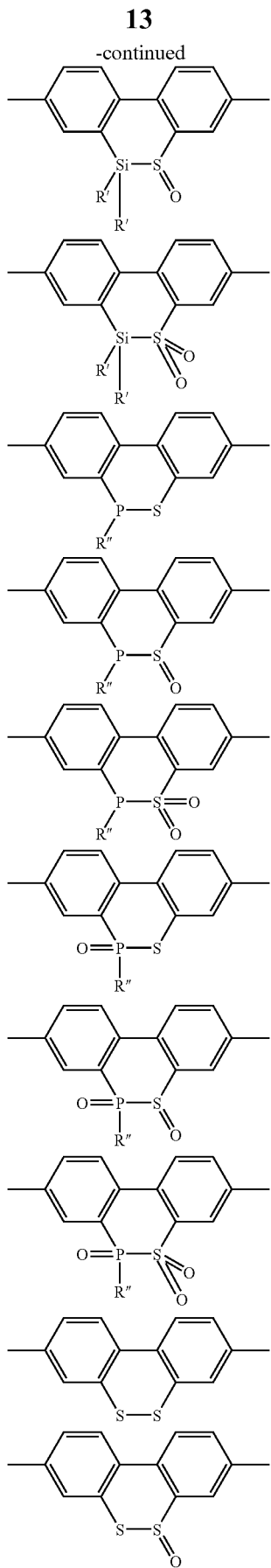

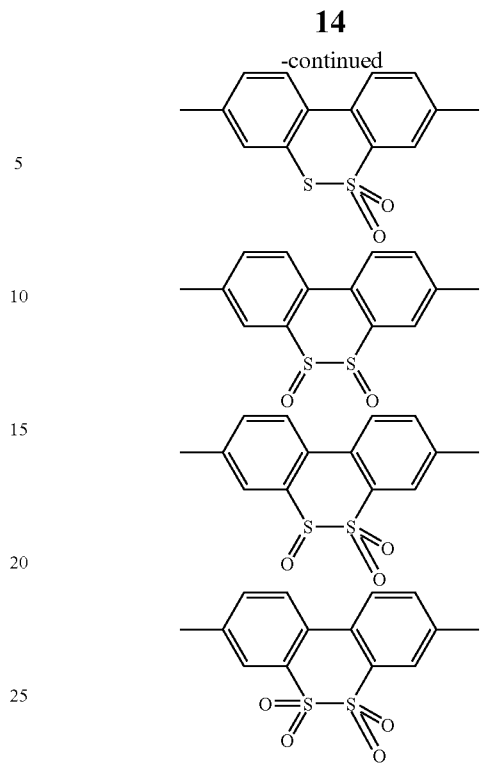

wherein, a hydrogen atom on a benzene ring may be substituted by a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group or a monovalent heterocyclic group. When two substituents exist at adjacent positions of a benzene ring, they may bond to each other to form a ring.

A polymer light emitter used in the present invention may contain, in addition to an arylene group and a bivalent heterocyclic group, for example, a repeating unit derived from an aromatic amine. This can impart a hole injectability and transportability to the polymer light emitter.

In this case, the molar ratio of the repeating unit composed of an arylene group and a bivalent heterocyclic group and the repeating unit derived from an aromatic amine is commonly in the range of 99:1 to 20:80.

As repeating units derived from an aromatic amine, the repeating units represented in the following chemical formula (2) are preferable.

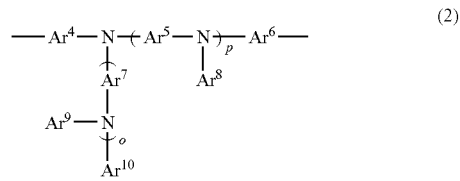

Wherein, $Ar^4$, $Ar^5$, $Ar^6$ and $Ar^7$ each independently denotes an arylene group or a bivalent heterocyclic group; $Ar^8$, $Ar^9$ and $Ar^{10}$ each independently denotes an aryl group or a monovalent heterocyclic group; and o and p each independently denotes 0 or 1, and $0 \leq o+p \leq 2$.

Herein, definitions and specific examples of an arylene group and a bivalent heterocyclic group are the same as described above. Definitions and specific examples of an aryl group and a monovalent heterocyclic group are the same as described in the above-mentioned $R^{1a}$, $R^{1b}$, $R^{1c}$, $R^{2a}$, $R^{2b}$, $R^{2c}$.

Repeating units shown in the chemical formula (2) above are exemplified by the following structures.

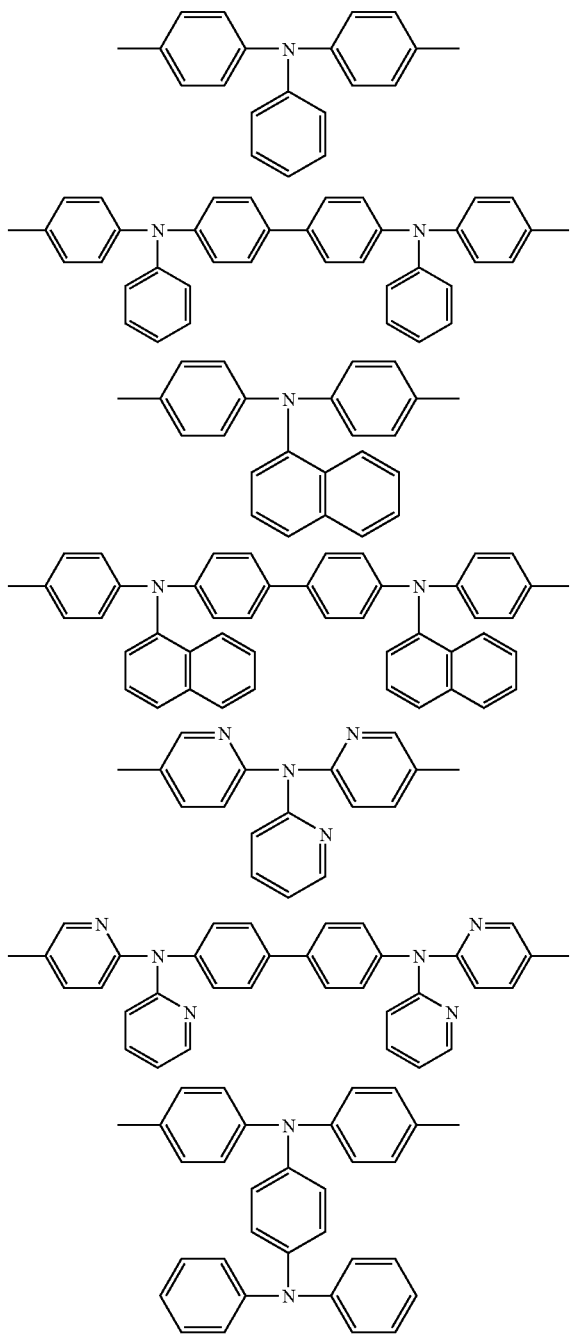

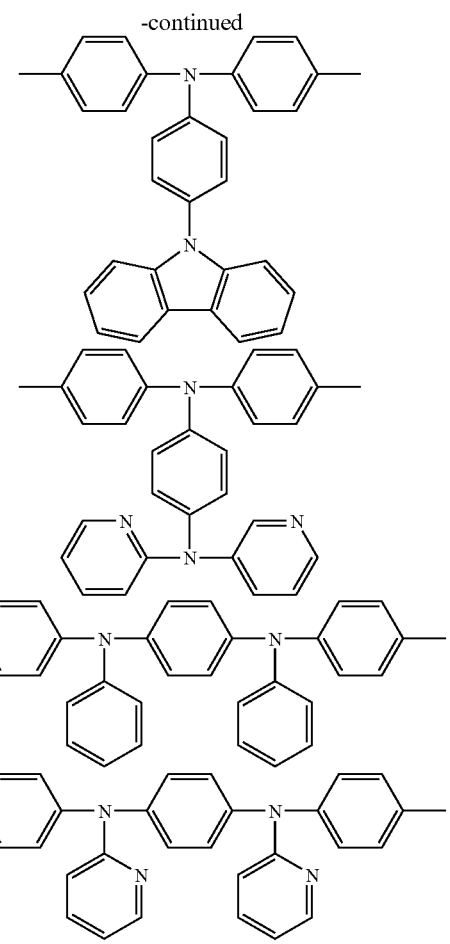

wherein, a hydrogen atom on an aromatic ring may be substituted by a substituent selected from a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group and a carboxyl group.

Among the repeating units represented in the chemical formula (2) above, a repeating unit represented by the chemical formula (3) below is especially preferable.

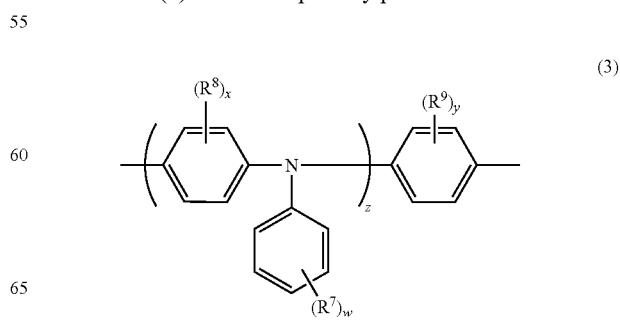

(3)

wherein, $R^7$, $R^8$ and $R^9$ each independently denotes a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group or a carboxyl group; and x and y each independently denotes an integer of 0 to 4, z denotes an integer of 0 to 2, and w denotes an integer of 0 to 5.

A polymer light emitter used in the present invention may be a random, block or graft copolymer, or may be a polymer having an intermediate structure thereof, for example, a random copolymer assuming a blocking property. From the view point of obtaining a polymer light emitter having a high quantum yield of light emission, a random copolymer assuming a blocking property, a block or a graft copolymer is preferable rather than a complete random copolymer. Cases of having a branched main chain and at least three terminals, and dendrimers are also included.

Since if terminal groups of a polymer light emitter used in the present invention remain intact as polymerization active groups, they may possibly decrease the light emission characteristics and life when made to be devices, they may be protected by a stable group. Terminal groups are preferably those having a conjugated bond continuing to a conjugated structure of the main chain, exemplified by a structure in which an aryl group or a heterocyclic group is bonded through a carbon-carbon bond, and specifically exemplified by substitutes described in Formula 10 in JP-A-09-45478.

A polymer light emitter used in the present invention preferably has a number-average molecular weight of about $10^3$ to $10^8$ in terms of polystyrene, further preferably that of about $10^4$ to $10^6$ in terms of polystyrene.

Since light emission from a thin film is utilized, the polymer light emitter to emit light in a solid state is suitably used.

Synthesis methods of a polymer light emitter used in the present invention are exemplified by a method of polymerizing concerned monomers by the Suzuki coupling reaction, a method of polymerizing by the Grignard reaction, a method of polymerizing using a Ni(0) catalyst, a method of polymerizing using an oxidizing agent such as $FeCl_3$, a method of electrochemically oxidatively polymerizing and a method by decomposition of an intermediate polymer having a suitable leaving group. Among these, a method of polymerizing by the Suzuki coupling reaction, a method of polymerizing by the Grignard reaction and a method of polymerizing using a Ni(0) catalyst are preferable because of their easy reaction controllability.

When a polymer light emitter is used as a light emission material of an organic EL device, since its purity influences the light emission characteristics, it is preferable that monomers before polymerization be purified by methods such as distillation, sublimation purification and recrystallization, and thereafter, the monomers be polymerized. Further, it is preferable that after the synthesis, the polymerized monomers be subjected to a purification treatment such as reprecipitation purification or fractionation by chromatography.

Solvents are exemplified by chloroform, methylene chloride, dichloroethane, tetrahydrofuran, toluene, xylene, mesitylene, tetralin, decalin and n-butylbenzene. Depending on structures and molecular weights of polymer light emitters, a polymer light emitter can commonly be dissolved in an amount of not less than 0.1 wt % in such a solvent.

The amount of a solvent is commonly about 1,000 to 100,000 parts by weight to 100 parts by weight of a polymer light emitter.

The polymer composition of the present invention may optionally be mixed with and contain a low-molecular, oligomer or dendrimer light emission pigment, a charge transport material and the like, in addition to a polymer emitter.

Polymer charge transport materials used in the present invention include polymer hole transport materials and polymer electron transport materials.

Among them, polymer hole transport materials are exemplified by polyvinylcarbazoles or their derivatives, polysilanes or their derivatives, polysiloxane derivatives having an aromatic amine in their side chain or main chain, pyrazoline derivatives, arylamine derivatives, stilbene derivatives, triphenyldiamine derivatives, polyanilines or their derivatives, polythiophenes or their derivatives, polypyrroles or their derivatives, poly(p-phenylenevinylene)s or their derivatives and poly(2,5-thienylenevinylene)s or their derivatives.

Polymer hole transport materials are specifically exemplified by those described in JP-A-63-70257, 63-175860, 2-135359, 2-135361, 2-209988, 3-37992 and 3-152184.

Polyvinylcarbazoles or their derivatives are obtained, for example, by cationic polymerization or radical polymerization of a vinyl monomer.

Polysilanes or their derivatives are exemplified by compounds described in Chem. Rev. Vol. 89, 1359 (1989) and British Patent GB2300196 laid-open specification. As a synthesis method, the methods described therein can be used, but especially the Kipping method is suitably used.

Polysiloxanes or their derivatives have almost no hole transportability in their siloxane skeleton structure, and therefore, those having a structure of the above-mentioned low-molecular hole transport material in their side chain or main chain are suitably used, and exemplified especially by those having a hole transportable aromatic amine in their side chain or main chain.

Among the polymer hole transport materials, polymer compounds composed of a repeating unit derived from an aromatic amine are especially preferable. The repeating unit derived from an aromatic amine is preferably one represented by the above-mentioned chemical formula (2), further preferably by the above-mentioned chemical formula (3).

Among polymer charge transport materials, as a polymer electron transport material, publicly-known materials can be used, and are exemplified by polyquinolines or their derivatives, polyquinoxalines or their derivatives and polyfluorenes or their derivatives.

When a polymer material used in the present invention is used for an organic EL device, since its purity influences the performances of devices such as the light emission characteristics, it is preferable that monomers before polymerization be purified by methods such as distillation, sublimation purification, recrystallization and column chromatography, and thereafter, the monomers be polymerized. Further, it is preferable that after the polymerization, the polymerized monomers be subjected to a purification treatment by common separation operations and purification operations such as acid washing, alkaline washing, neutralization, water washing, organic solvent washing, reprecipitation, centrifugation, extraction, column chromatography and dialysis, and by drying and other operations.

The polymer composition of the present invention contains a polymer charge transport material or a polymer light emitter and a crosslinking agent. The composition of the present invention may contain a solvent. The composition may further contain, in addition to them, additives such as a charge transport material, a light emission material, a surfactant and a stabilizer. The proportion of a polymer charge transport material or a polymer light emitter in the composition is 20 wt % to 100 wt % to the total weight of the composition except the solvent, preferably 40 wt % to 100 wt %.

The proportion of a solvent in the composition is commonly 1 wt % to 99.9 wt % to the total weight of the composition, preferably 60 wt % to 99.5 wt %, further preferably 80 wt % to 99.0 wt %.

As a method for forming a film according to the present invention, coating methods such as the spin coat method, casting method, microgravure coat method, gravure coat method, bar coat method, roll coat method, wire bar coat method, dip coat method, spray coat method, screen printing method, flexography, offset printing method and inkjet printing method can be used. Printing methods such as the screen printing method, flexography, offset printing method and inkjet printing method are preferable in that the pattern formation and the selective coating of multicolor are easy.

The viscosity of the polymer composition of the present invention is, depending on printing methods, but when the polymer composition is discharged as an ink composition through a jetting device like the inkjet printing method, preferably in the range of 1 to 20 mPa·s at 25° C. for preventing the clogging and the flight deflection on jetting.

A solvent used in the polymer composition of the present invention is not especially limited, but is preferably one which can dissolve or homogeneously disperse materials other than the solvent in the composition. When materials constituting the composition are soluble in a nonpolar solvent, the solvent is exemplified by chlorine-based solvents such as chloroform, methylene chloride and dichloroethane, etheric solvents such as tetrahydrofuran, aromatic hydrocarbon solvents such as toluene, xylene, tetralin, anisole, n-hexylbenzene, cyclohexylbenzene, monochlorobenzene and o-dichlorobenzene, aliphatic hydrocarbon solvents such as decalin and bicyclohexyl, and ketonic solvents such as acetone, methyl ethyl ketone and 2-heptanone, and esteric solvents such as ethyl acetate, butyl acetate, ethyl cellosolve acetate and propylene glycol monomethyl ether acetate.

The dissolution, when an upper layer is wet-coated, of a layer formed by using the polymer composition of the present invention can be suppressed, for example, by curing the layer by the action of heat or light. When the wet-coated upper layer is wet-coated with a further upper layer, the polymer composition of the present invention is preferably used and cured for the upper layer. When no wet-coating is performed on the wet-coated upper layer, since there is no risk of the dissolution, a composition containing no crosslinking agent may be used for the upper layer.

In an organic EL device fabricated using the polymer composition of the present invention, the thickness of a charge transport layer or light emission layer has different optimum thicknesses depending on materials to be used, and is selected so that the driving voltage and the light emission efficiency have suitable values, and is, for example, 1 nm to 1 µm, preferably 2 nm to 500 nm, further preferably 5 nm to 200 nm.

An organic EL device fabricated using the polymer composition of the present invention is characterized in that the device has a charge transport layer or a light emission layer between electrodes composed of an anode and a cathode, and that the charge transport layer or the light emission layer is formed using the composition of the present invention.

A charge transport layer includes an electron transport layer (ordinarily between a cathode and a light emission layer) and a hole transport layer (ordinarily between an anode and a light emission layer).

When a charge transport layer is a hole transport layer, and additionally when only one layer of the charge transport layer is present between an anode and a light emission layer, the layer may be expressed by any namings of a hole injection layer, hole transport layer and hole injection/transport layer.

Among hole transport layers, that contacting with an anode is named a hole injection layer. The polymer composition of the present invention has a feature of exhibiting excellent performances when used as a hole injection layer.

That devices whose hole transport layer is formed of the polymer composition of the present invention have a structure in which the hole transport layer contacts with an anode (when the hole transport layer is a hole injection layer), is preferable in that the devices exhibit excellent performances.

A substrate to form the organic EL device of the present invention is any one as long as it does not change when electrodes and organic layers are formed, and is exemplified by glass, plastics, polymer films and silicon substrates. In the case of an opaque substrate, the opposite electrode is preferably transparent or translucent.

In an organic EL device fabricated using the polymer composition of the present invention, at least one of electrodes composed of an anode and a cathode is generally transparent or translucent, and the anode side is preferably transparent or translucent. As a material for an anode, a conductive metal oxide film, translucent metal thin film and the like are used. Specifically, films (NESA, etc.) fabricated using conductive glasses composed of indium oxide, zinc oxide, tin oxide, and compound bodies thereof, i.e., indium tin oxide (ITO) and indium zinc oxide, and gold, platinum, silver, copper and the like are used, and ITO, indium zinc oxide and tin oxide are preferable. Fabricating methods include the vacuum deposition method, sputtering method, ion plating method and plating method. As the anode, transparent conductive organic films such as polyanilines or their derivatives and polythiophenes or their derivatives may be used.

The thickness of an anode can be suitably selected in consideration of the optical transitiveness and the electric conductivity, but is, for example, 10 nm to 10 µm, preferably 20 nm to 1 µm, further preferably 50 nm to 500 nm.

Further, on an anode, for facilitating charge injection, a layer composed of a phthalocyanine derivative, conductive polymer, carbon or the like, or a layer having an average film thickness of not more than 2 nm composed of a metal oxide, metal fluoride, organic insulating material and the like may be provided.

As a material for a cathode used in an organic EL device fabricated using the polymer composition of the present invention, materials having a small work function are preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium, alloys of two or more thereof, alloys of one or more thereof and one or more of gold, silver, platinum, copper, manganese, titanium, cobalt, nickel, tungsten and tin, and graphite or graphite intercalation compounds, and the like, are used. Examples of alloys include magnesium-silver alloy, magnesium-indium alloy, magnesium-aluminum alloy, indium-silver alloy, lithium-aluminum alloy, lithium-magnesium alloy, lithium-indium alloy and calcium-aluminum alloy. The cathode may have a laminate structure of two or more layers.

The thickness of a cathode can be suitably selected in consideration of the electric conductivity and the durability, but is, for example, 10 nm to 10 μm, preferably 20 nm to 1 μm, further preferably 50 nm to 500 nm.

As a fabricating method of a cathode, the vacuum deposition method, sputtering method, laminate method in which a metal thin film is heat-bonded, and the like are used. A layer composed of a conductive polymer, or a layer having an average film thickness of not more than 2 nm composed of a metal oxide, metal fluoride, organic insulating material or the like may be provided between a cathode and an organic layer, and a protection layer to protect the organic EL device may be provided after fabrication of the cathode. For using an organic EL device stably for a long period, a protection layer and/or a protection cover are preferably provided for protecting the device from outside.

As the protection layer, polymer compounds, metal oxides, metal fluorides, metal borides and the like can be used. As the protection cover, glass plates, plastic plates whose surface has been subjected to a low water-permeability treatment, and the like can be used, and a method in which the cover is laminated on a device substrate with a thermosetting resin or photocurable resin for hermetical sealing is suitably used. If a space is maintained by using a spacer, the device is easily prevented from being harmed. If an inert gas such as nitrogen or argon is enclosed in the space, oxidation of the cathode is prevented; further, if a desiccant such as barium oxide is installed in the space, damaging of moisture adsorbed in a manufacturing process to the device is easily suppressed. One or more of these countermeasures are preferably employed.

An organic EL device fabricated using the polymer composition of the present invention can be used as planar light sources, segment displays, dot matrix displays, backlights for liquid crystal displays and the like.

For obtaining a planar light emission by using an organic EL device fabricated using the polymer composition of the present invention, a planar anode and a planar cathode are arranged so as to be superposed. For obtaining a patterned light emission, there are a method in which a mask provided with a patterned window is installed on the surface of the planar light emission device, a method in which non-light emission portions are substantially made so by forming an extremely thick organic layer in the non-light emission portions, and a method in which the electrode(s) of one or both of the anode and the cathode is formed in a patterned shape. By forming a pattern by one of these methods and by arranging some electrodes so as to be independently turned on/off, a display device of segment type which can display numerals, characters and simple symbols is obtained. Further, for making a dot matrix device, anodes and cathodes are both orthogonally formed in stripes. By a method in which a plurality of polymer light emitters different in emission color are selectively coated, and a method in which a color filter or emission turnable filter is used, the partial color display and the multicolor display become possible. Dot matrix devices can be driven passively, and may be driven actively in combination with TFT and the like. These display devices can be used as displays for computers, televisions, mobile terminals, mobile phones, car navigations and viewfinders of video cameras.

EXAMPLES

Hereinafter, examples will be shown for describing the present invention further in detail, but the scope of the present invention is not limited thereto.

The number-average molecular weight in terms of polystyrene was determined by SEC.

As a column, TOSOH TSKgel SuperHM-H (two columns)+ TSKgel SuperH2000 (4.6 mm i.d.×15 cm) was used; as a detector, RI (SHIMADZU RID-10A) was used; as a mobile phase, tetrahydrofuran (THF) was used.

Synthesis Example 1

Synthesis of a Polymer Compound 1

N,N'-bis(4-bromophenyl)-N,N'-bis(4-n-butylphenyl)-1,4-phenylenediamine (3.3 g, 4.8 mmol) and 2,2'-bipyridyl (1.9 g, 12 mmol) were dissolved in 132 ml of dehydrated tetrahydrofuran, and then the resultant mixture was bubbled with nitrogen to substitute nitrogen in the system. Bis(1,5-cyclooctadiene)nickel(0){Ni(COD)$_2$} (3.3 g, 12 mmol) was added to the solution in a nitrogen atmosphere, raised in temperature to 60° C., and allowed to react for 3.5 hours while stirred. After the reaction, the reaction solution was cooled to room temperature (about 25° C.), dropwise added in a mixed solution of 30 ml of 25% ammonia water/480 ml of methanol/ 160 ml of ion exchange water, stirred for 1 hour; then, a deposited precipitate was filtered, dried under reduced pressure for 2 hours, and dissolved in 150 ml of toluene. Thereafter, 120 g of 1 N hydrochloric acid was added to the solution, and stirred for 3 hours; a water layer was removed; an organic layer was charged with 140 ml of 25% ammonia water and stirred for 3 hours, and then a water layer was removed. The organic layer was washed twice with 600 ml of water. The organic layer was divided into two; each was dropwise added in 600 ml of methanol, and the resultant mixture was stirred for 1 hour; a deposited precipitate was filtered, and dried for 2 hours under reduced pressure. The yield of an obtained polymer (hereinafter, referred to as polymer compound 1) was 3.26 g. The average molecular weight and the weight-average molecular weight in terms of polystyrene were Mn=1.6×10$^4$ and Mw=1.2×10$^5$, respectively.

Synthesis Example 2

Synthesis of a Compound A

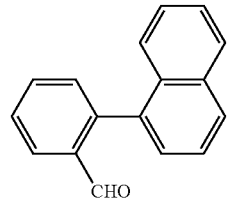

Compound A 5.00 g (29 mmol) of 1-naphthaleneboric acid, 6.46 g (35 mmol) of 2-bromobenzaldehyde, 10.0 g (73 mmol) of potassium carbonate, 36 ml of toluene and 36 ml of ion exchange water were charged in a three-neck flask of 300 ml in an inert atmosphere, and the resultant mixture was bubbled with argon for 20 min while stirred at room temperature. Then, 16.8 mg (0.15 mmol) of tetrakis(triphenylphosphine)palladium was added to the solution, and the resultant mixture was further bubbled with argon for 10 min while stirred at room temperature. The solution was raised in temperature to 100° C., and allowed to react for 25 hours. After the resultant was cooled to room temperature, an organic layer was extracted with toluene, dried with sodium sulfate, and then the solvent was distilled off. By purification through a silica gel column using as a development solvent a mixed solvent of toluene:cyclohexane=1:2, 5.18 g (a yield of 86%) of a compound A was obtained as a white crystal.

¹H-NMR (300 MHz/CDCl₃):

δ 7.39-7.62 (m, 5H), 7.70 (m, 2H), 7.94 (d, 2H), 8.12 (dd, 2H), 9.63 (s, 1H)

MS (APCI (+)): (M+H)⁺ 233

Synthesis Example 3

Synthesis of a Compound B

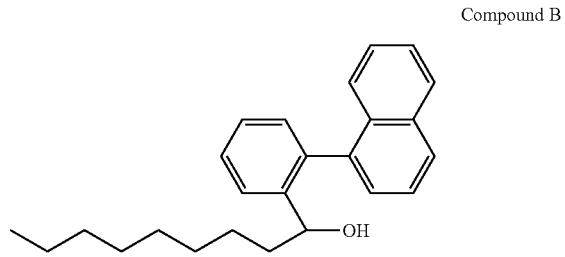

Compound B 8.00 g (34.4 mmol) of the compound A and 46 ml of dehydrated tetrahydrofuran (THF) were charged in a three-neck flask of 300 ml in an inert atmosphere, and cooled to −78° C.

Then, 52 ml of n-octylmagnesium bromide (1.0 mol/L THF solution) was dropwise added to the solution over 30 min. After the finish of the dropwise addition, the solution was raised in temperature to 0° C., and stirred for 1 hour; thereafter, the solution was raised in temperature to room temperature, and stirred for 45 min. 20 ml of 1 N hydrochloric acid was added to the solution in an ice bath to finish the reaction; an organic layer was extracted with ethyl acetate and dried with sodium sulfate. After the solvent was removed, purification through a silica gel column using as a development solvent a mixed solvent of toluene:hexane=10:1 gave 7.64 g (a yield of 64%) of a compound B as a light yellow oil. Since although two peaks were observed in the HPLC measurement, the same mass number was observed in the LC-MS measurement, the oil was judged as a mixture of isomers.

Synthesis Example 4

Synthesis of a Compound C

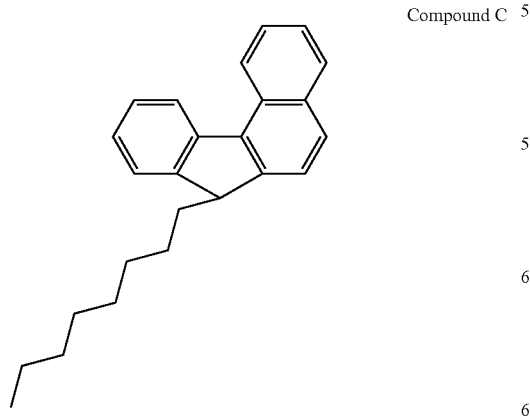

Compound C 5.00 g (14.4 mmol) of the compound B (a mixture of isomers) and 74 ml of dehydrated dichloromethane were charged in a three-neck flask of 500 ml in an inert atmosphere, and the resultant mixture was stirred at room temperature to dissolve them.

Then, an etherate complex of boron trifluoride was dropwise added to the solution at room temperature over 1 hour, and after the finish of the dropwise addition, the solution was stirred at room temperature for 4 hours. The solution was slowly charged with 125 ml of ethanol while being stirred; after heat generation had diminished, an organic layer was extracted with chloroform, washed twice with water, and dried with magnesium sulfate. After the solvent was distilled off, purification through a silica gel column using hexane as a development solvent gave 3.22 g (a yield of 68%) of a compound C as a colorless oil.

¹H-NMR (300 MHz/CDCl₃):

δ 0.90 (t, 3H), 1.03-1.26 (m, 14H), 2.13 (m, 2H), 4.05 (t, 1H), 7.35 (dd, 1H), 7.46-7.50 (m, 2H), 7.59-7.65 (m, 3H), 7.82 (d, 1H), 7.94 (d, 1H), 8.35 (d, 1H), 8.75 (d, 1H)

MS (APCI(+)): (M+H)⁺ 329

Synthesis Example 5

Synthesis of a Compound D

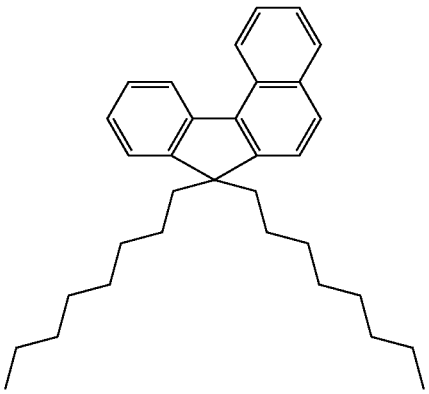

Compound D 20 ml of ion exchange water was charged in a three-neck flask of 200 ml in an inert atmosphere, and 18.9 g (0.47 mol) of sodium hydroxide was added thereto little by little while stirred to dissolve it. After the aqueous solution was cooled to room temperature, 20 ml of toluene, 5.17 g (15.7 mmol) of the compound C and 1.52 g (4.72 mmol) of tributylammonium bromide were added to the solution, and the resultant mixture was raised in temperature to 50° C. n-Octyl bromide was dropwise added to the solution, and after the dropwise addition, the solution was allowed to react at 50° C. for 9 hours. After the reaction, an organic layer was extracted with toluene, washed twice with water, and dried with sodium sulfate. Purification through a silica gel column using hexane as a development solvent gave 5.13 g (a yield of 74%) of a compound D as a yellow oil.

¹H-NMR (300 MHz/CDCl₃):

δ 0.52 (m, 2H), 0.79 (t, 6H), 1.00-1.20 (m, 22H), 2.05 (t, 4H), 7.34 (d, 1H), 7.40-7.53 (m, 2H), 7.63 (m, 3H), 7.83 (d, 1H), 7.94 (d, 1H), 8.31 (d, 1H), 8.75 (d, 1H)

MS (APCI(+)): (M+H)⁺ 441

Synthesis 6

Synthesis of a Compound E

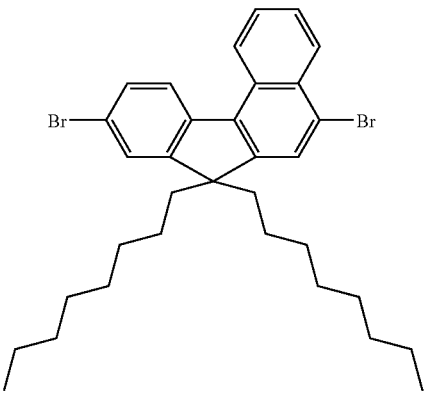

Compound E 4.00 g (9.08 mmol) of the compound D and 57 ml of a mixed solvent of acetic acid:dichloromethane 1:1 were charged in a three-neck flask of 50 ml in an inert atmosphere, and the resultant mixture was stirred at room temperature to dissolve them. Then, the solution was charged with 7.79 g (20.0 mmol) of benzyltrimethylammonium tribromide, and while being stirred, charged with zinc chloride until the benzyltrimethylammonium tribromide had been dissolved completely. After the solution was stirred at room temperature for 20 hours, the solution was charged with 10 ml of a 5% sodium hydrogensulfite aqueous solution to stop the reaction; an organic layer was extracted with chloroform, washed twice with a potassium carbonate aqueous solution, and dried with sodium sulfate. After purifying twice the resultant through a flash column using hexane as a development solvent, the resultant was recrystallized with a mixed solvent of ethanol:hexane=1:1, and then with the mixed solvent of 10:1, thereby obtaining 4.13 g (a yield of 76%) of a compound E as a white crystal.

$^1$H-NMR (300 MHz/CDCl$_3$):

δ 0.60 (m, 2H), 0.91 (t, 6H), 1.01-1.38 (m, 22H), 2.09 (t, 4H), 7.62-7.75 (m, 3H), 7.89 (s, 1H), 8.20 (d, 1H), 8.47 (d, 1H), 8.72 (d, 1H)

MS (APPI(+)): (M+H)$^+$ 598

Synthesis Example 7

Synthesis of a Polymer Compound 2

22.5 g of the compound E and 17.6 g of 2,2'-bipyridyl were charged in a reaction vessel, and thereafter, nitrogen gas was substituted in the reaction system. 1,500 g of tetrahydrofuran (dehydrated solvent) which had previously been bubbled with argon for deaeration was added thereto. Then, the mixed solution was charged with 31 g of bis(1,5-cyclooctadiene)nickel(0), stirred at room temperature for 10 min, and allowed to react at 60° C. for 3 hours. The reaction was performed in a nitrogen gas atmosphere.

After the reaction, the reaction solution was cooled; then, a mixed solution of 200 ml of 25% ammonia water/900 ml of methanol/900 ml of ion exchange water was poured in the reaction solution, and the resultant mixture was stirred for about 1 hour. Then, produced precipitate was filtered and recovered. The precipitate was dried under reduced pressure and then dissolved in toluene. The toluene solution was filtered to remove undissolved substances, and purified through a column filled with alumina. Then, the toluene solution was washed with 1 N hydrochloric acid aqueous solution, allowed to stand, and liquid-separated to recover the toluene solution. Then, the toluene solution was washed with an about 3% ammonia water, allowed to stand, and liquid-separated to recover the toluene solution. Then, the toluene solution was washed with an ion exchange water, allowed to stand, and liquid-separated to recover the toluene solution. Then, the toluene solution was poured in methanol to reprecipitate and produce a precipitate. The produced precipitate was recovered, washed with methanol, and dried under reduced pressure to obtain 6.0 g of a polymer. The polymer was referred to as a polymer compound 2. The weight-average molecular weight of the obtained polymer compound 2 in terms of polystyrene was $8.2 \times 10^5$, and the number-average molecular weight thereof was $1.0 \times 10^5$.

Synthesis Example 8

Synthesis of a Polymer Compound 3

9,9-dioctylfluorene-2,7-bis(ethyleneboronate) (0.64 g, 1.2 mmol) and 0.75 g (1.1 mmol) of N,N'-bis(4-bromophenyl)-N,N'-bis(4-n-butylphenyl)1,4-phenylenediamine were dissolved in toluene (8.5 g), charged with tetrakis(triphenylphosphine)palladium (4 mg, 0.0036 mmol), and the resultant mixture was stirred for 10 min at room temperature. Thereafter, the solution was charged with 4 ml of a 20% tetraethylammonium hydride aqueous solution, raised in temperature to 110° C., and allowed to react for 18 hours while being stirred. Thereafter, bromobenzene (0.28 g, 1.78 mmol) was dissolved in 1 ml of toluene and added to the reaction solution, and the reaction solution was stirred at 110° C. for 2 hours. Then, phenylboric acid (0.22 g, 1.49 mmol) was added to the reaction solution, and the reaction solution was stirred at 110° C. for 2 hours. After the reaction solution was cooled to 50° C., an organic layer was dropwise added in 200 ml of a mixed solution of methanol/water (1/1), and stirred for 1 hour. A precipitate was filtered, washed with methanol and with ion exchange water, and dried under reduced pressure. Then, the precipitate was dissolved in 50 ml of toluene and the solution was purified through a silica column (a silica amount of 15 ml). The solution after the purification was dropwise added in 150 ml of methanol, stirred for 1 hour; a precipitate was filtered and dried under reduced pressure to obtain a polymer compound 3. The yield of the obtained polymer compound 3 was 0.70 g. The average molecular weight of the polymer compound 3 in terms of polystyrene was Mn=$3.0 \times 10^4$ and Mw=$6.1 \times 10^4$.

Synthesis Example 9

Synthesis of a Polymer Compound 4

(Synthesis of Compounds F, G, J and I)

N,N'-bis(4-bromophenyl)-N,N'-bis(4-n-butylphenyl)1,4-phenylenediamine (1.911 g), N,N'-bis(4-bromophenyl)phenylamine (0.484 g) and 2,2'-bipyridyl (1.687 g) were dissolved in an inert atmosphere in 109 ml of dehydrated tetrahydrofuran which had previously been bubbled with argon. The solution was raised in temperature to 60° C., then charged with bis(1,5-cyclooctadiene)nickel(0) {Ni(COD)$_2$} (2.971 g), stirred, and allowed to react for 5 hour. The reaction solution was cooled to room temperature, dropwise added in 109 ml of a mixed solution of 14 ml of 25% ammonia water/109 ml of methanol/109 ml of ion exchange water, and stirred for 1 hour; thereafter, a deposited precipitate was filtered, dried under reduced pressure, and dissolved in 120 ml of toluene. After the dissolution, 0.48 g of radiolite was added to the solution, and the resultant mixture was stirred for 30 min; then, undissolved substances were filtered out. An obtained filtrate was purified through an alumina column. Then, 236 ml of a 4% ammonium water was added to the purified filtrate, and the resultant mixture was stirred for 2 hours; thereafter, a water layer was removed. Further, about 236 ml of ion exchange water was added to an organic layer, and the resultant mixture was stirred for 1 hour; then, a water layer was removed. Thereafter, the organic layer was poured in 376 ml of methanol, and the resultant mixture was stirred for 0.5 hours; a deposited precipitate was filtered and dried under reduced pressure. The yield of an obtained polymer (hereinafter, referred to as polymer compound 4) was 1.54 g.

The number-average molecular weight and the weight-average molecular weight thereof in terms of polystyrene were $Mn=7.4\times10^3$ and $Mw=7.6\times10^4$, respectively.

Compounds F, G and J were synthesized according to WO2000/046321. Compound I was synthesized according to US2004127666.

Synthesis Example 10

Synthesis of a Compound H

The reaction was performed in a glove box. 345.53 g of potassium carbonate, 24.9 g of potassium iodide, 39.65 g of 18-Crown-6, 2.5 L of DMF and 162.86 g of 2-chloroethyl ethyl ether were charged in a three-neck flask of 5 L, and stirred. Then, 254.1 g of 9,9-di(4-hydroxyphenyl)-2,7-dibromofluorene (U.S. Pat. No. 5,447,960) was added little by little thereto. After stirred at 116° C. overnight, the resultant was cooled and poured in 2 L of ice water, and the resultant mixture was stirred and allowed to stand overnight. A solid was filtered off and washed with water. After the solid was air-dried, 5.05 g of a crude product was obtained. The crude product was recrystallized with 1-propanol/n-octane to obtain 316.02 g of a compound H.

Synthesis Example 11

Synthesis of a Polymer Compound 5

1.72 g of Aliquat336, 6.2171 g of the compound F, 0.5085 g of the compound G, 6.2225 g of the compound H and 0.5487 g of the compound I were charged in a four-neck flask of 500 ml, and nitrogen was substituted therein. The mixture was charged with 100 ml of toluene, charged with 7.6 mg of dichlorobis(triphenylphosphine)palladium(II) and 24 ml of a sodium carbonate aqueous solution, and the resultant mixture was stirred for 3 hours under reflux, and thereafter, charged with 0.40 g of phenylboric acid and the resultant mixture was stirred overnight. The resultant was charged with sodium N,N-diethyldithiocarbamate aqueous solution, and the resultant mixture was further stirred for 3 hours under reflux. The reaction solution was liquid-separated; an organic phase was washed with an acetic acid aqueous solution and with water, thereafter, dropwise added in methanol to precipitate a polymer. After filtration and drying under reduced pressure, the precipitate was dissolved in toluene, the resultant mixture was passed through a silica gel-alumina column and washed with toluene. The obtained toluene solution was dropwise added in methanol to precipitate a polymer. After filtration and drying under reduced pressure, the obtained polymer was dissolved in toluene and the resultant mixture was dropwise added in methanol to precipitate the polymer. The polymer was filtered off and dried under reduced pressure to obtain 7.72 g of a polymer compound 5 with $Mn=1.2\times10^5$ and $Mw=2.9\times10^5$.

Compound F

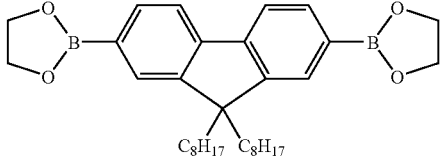

Compound G

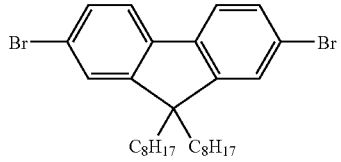

Compound H

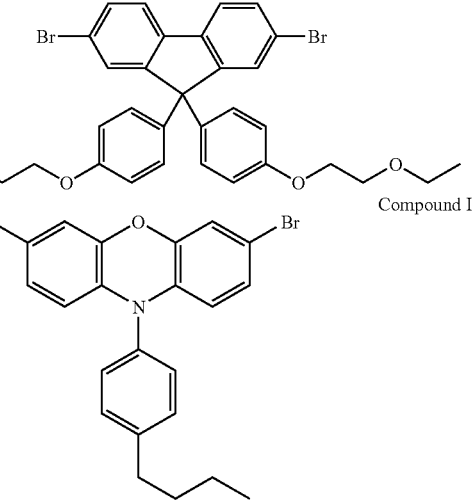

Compound I

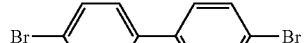

Synthesis Example 12

Synthesis of a Polymer Compound 6

0.91 g of Aliquat336, 5.23 g of the compound F and 4.55 g of the compound J were charged in a separable flask of 200 ml, and nitrogen was substituted therein. The mixture was charged with 70 ml of toluene, and with 2.0 mg of palladium acetate and 15.1 mg of tris(o-tolyl)phosphine, and the resultant mixture was refluxed. 19 ml of a sodium carbonate aqueous solution was dropwise added thereto, and the solution was stirred overnight under reflux, and then charged with 0.12 g of phenylboric acid and the resultant mixture was stirred for 7 hours. A reaction solution was charged with 300 ml of toluene and liquid-separated; an organic phase was washed with an acetic acid aqueous solution and with water, then charged with a sodium N,N-diethyldithiocarbamate aqueous solution, and stirred 4 hours. After liquid-separation, the solution was passed through a silica gel-alumina column, and washed with toluene. The resultant was dropwise added in methanol to precipitate a polymer. After filtration and drying under reduced pressure, the obtained polymer was dissolved in toluene; the obtained toluene solution was dropwise added in methanol to precipitate the polymer. The polymer was filtered off and dried under reduced pressure to obtain 6.33 g of a polymer compound 6 with $Mn=8.8\times10^4$ and $Mw=3.2\times10^5$.

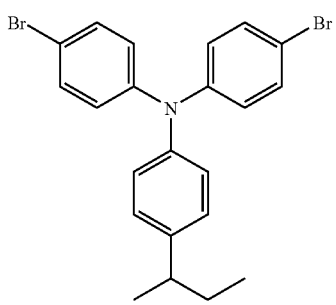

Compound J

Examples 1 to 9 and Comparative Examples 1 to 4

1 wt % of a polymer compound as shown in Table 1 was mixed and dissolved in toluene; further, an additive(s) of a kind and an addition amount as shown in Table 1 was added therein. Then, the solution was filtered with a Teflon® filter of 0.2 μm in diameter to prepare a coating solution.

The obtained solution was coated as a film on a glass substrate by spin coat. The substrate coated with the film containing no photoinitiator was baked in a nitrogen atmosphere under a baking condition of 300° C./20 min. The substrate coated with the film containing a photoinitiator was exposed in a nitrogen atmosphere for 1 min to UV rays by a high-pressure mercury lamp of 50 W/cm$^2$ in luminance measured with i-line (365 nm), and thereafter, baked in a nitrogen atmosphere under a baking condition of 150° C./20 min. Thereafter, these substrates were washed with toluene; then the thicknesses of the films before and after the toluene rinsing were measured by a film thickness meter of contact probe type (Alpha-Step, KLA-Tencor Corp.). The toluene rinsing was performed by mounting toluene on the substrate by a spin coater in a state of the toluene rising above the substrate due to its surface tension and then rotating the substrate at 4,000 rpm to throw off the toluene on the substrate. The results are shown in Table 1.

TABLE 1

| | Composition of polymer compound | Kind and addition amount of crosslinking agent (parts by weight *1) | Kind and addition amount of photoinitiator (parts by weight *2) | Film thickness before toluene rinsing | Film thickness after toluene rinsing |
|---|---|---|---|---|---|
| Example 1 | Polymer compound 1 = 100 | DPHA (100 parts) | No addition | 40 nm | 35 nm |
| Example 2 | Polymer compound 1 = 100 | DPHA (25 parts) | No addition | 40 nm | 30 nm |
| Example 3 | Polymer compound 1 = 100 | DPHA (25 parts) | I369 (0.5 part) | 50 nm | 50 nm |
| Example 4 | Polymer compound 1 = 100 | DPHA (25 parts) | I907 (0.5 part) | 50 nm | 50 nm |
| Example 5 | Polymer compound 1 = 100 | DPHA (25 parts) | TAZPP (0.5 part) | 50 nm | 50 nm |
| Example 6 | Polymer compound 3 = 100 | DPHA (25 parts) | No addition | 30 nm | 10 nm |
| Example 7 | Polymer compound 4 = 100 | DPHA (25 parts) | No addition | 40 nm | 20 nm |
| Example 8 | Polymer compound 1 = 100 | TPE-A (25 parts) | No addition | 50 nm | 35 nm |
| Example 9 | Polymer compound 1 = 100 | Butanedioldiacrylate (70 parts) | No addition | 55 nm | 20 nm |
| Comparative Example 1 | Polymer compound 1 = 100 | No addition | No addition | 40 nm | 0 nm |
| Comparative Example 2 | Polymer compound 3 = 100 | No addition | No addition | 30 nm | 0 nm |
| Comparative Example 3 | Polymer compound 4 = 100 | No addition | No addition | 40 nm | 0 nm |
| Comparative Example 4 | Polymer compound 1 = 100 | IMM (100 parts) | No addition | 30 nm | 10 nm |

*1 An addition amount of a crosslinking agent to 100 parts by weight of the total weight of a polymer compound
*2 An addition amount of a photoinitiator to 100 parts by weight of the addition amount of a crosslinking agent
DPHA: dipentaerythritol hexaacrylate (KAYARAD DPHA, Nippon Kayaku Co.)
TPE-A: trispentaerythritol octaacrylate (Koei Chemical Co., Ltd.)
Butanediol diacrylate: 1,4-butanediol acrylate (Alfa Aesar Co.)
HMM: hexamethoxymethylmelamine represented by the following formula; a crosslinking agent

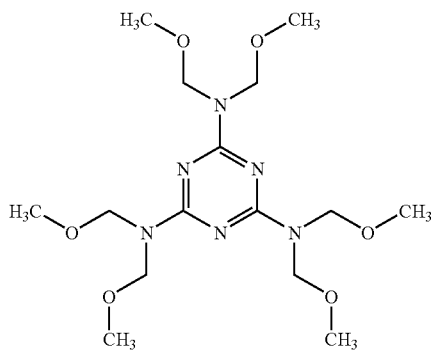

I369: Irgacure369; a photoinitiator made by Chiba Speciality Chemicals Corp.
I907: Irgacure907; a photoinitiator made by Chiba Speciality Chemicals Corp.
TAZPP: triazine PP; a photoinitiator made by Nihon Siber Hegner K.K.

Examples 10 to 19 and Comparative Examples 5 to 7

Fabrication of Hole Injection Layers

The each solution of Examples 1 to 9 and Comparative Example 4 was coated as a film by spin coating on a glass substrate on which an ITO film had been bonded in a thickness of 150 nm by sputtering. As in Table 1, the substrate coated with the film containing no photoinitiator was baked in a nitrogen atmosphere under a baking condition of 300° C./20 min, and the substrate coated with the film containing a photoinitiator was exposed in a nitrogen atmosphere for 1 min to UV rays by a high-pressure mercury lamp of 50 W/cm$^2$ in luminance measured with i-line (365 nm), and thereafter, baked in a nitrogen atmosphere under a baking condition of 150° C./20 min (Examples 10 to 19 and Comparative Example 7).

A solution (Baytron, Stalk V Tech Ltd.) of PEDOT: poly(ethylenedioxythiophene)/polystyrenesulfonic acid was coated as a film by spin coating on a glass substrate on which an ITO film had been bonded in a thickness of 150 nm by sputtering, and the coated substrate was dried at 200° C. for 10 min on a hot plate to form a PEDOT layer of a hole injection layer having a thickness of 50 nm (Comparative Examples 5 and 6).

In the film of the hole injection layer fabricated of the solution containing much of the crosslinking agent in Example 1, haze was slightly observed. For the other hole injection layers, smooth films having no haze were obtained.

<Preparation of Solution Compositions for Light Emission Layers>

0.5 wt % of a polymer compound as shown in Table 2 was mixed and dissolved in toluene; further, an additive(s) of a kind and an addition amount as shown in Table 2 was added therein. Thereafter, the solution was filtered with a Teflon® filter of 0.2 μm in diameter to prepare a coating solution.

<Fabrication and Evaluation of Devices>

On the fabricated hole injection layer, the prepared polymer light emitter coating solution was coated as a film having a thickness of about 70 nm by spin coating. Further, the coated layer was dried under reduced pressure at 90° C. for 1 hour; then, lithium fluoride was deposited by 4 nm as a cathode buffer layer; calcium was deposited by 5 nm as a cathode; then aluminum was deposited by 100 nm to fabricate an organic EL device. The vacuum degree in the every deposition was $1 \times 10^{-5}$ to $9 \times 10^{-5}$ Torr. While a voltage was stepwise applied to the obtained device having a light emission part of 2 mm×2 mm (area of 4 mm$^2$), luminances of EL light emission from the polymer light emitter were measured, and current efficiencies were thereby obtained. The maximum value of the current efficiencies and the center wavelength of EL light emission of the obtained device are shown in Table 2.

As shown in Table 1, the films obtained by coating the polymer solution compositions in Examples are cured by action of heat or light; the dissolution of the films after toluene rinsing are suppressed; thus, layer structures can be formed by wet coating. Further, as shown in Table 2, as compared with the polymer light emission devices using hole injection layers of the PEDOT layer in Comparative Examples, the polymer light emission devices using hole injection layers fabricated of the polymer solution compositions in Examples exhibit remarkable improvements in efficiency. The layer using a crosslinking agent having an aromatic ring in its molecule of Comparative Example 4 had a low efficiency as shown in Table 2 though the dissolution of the film after toluene rinsing was suppressed as shown in Table 1.

Example 20 and Comparative Examples 8 and 9

1 wt % of the polymer compound as shown in Table 3 was mixed and dissolved in toluene; further, an additive of a kind and an addition amount as shown in Table 3 was added

TABLE 2

|  | Composition of polymer compound | Kind and addition amount of crosslinking agent (parts by weight *4) | Hole injection layer | Maximum efficiency (Cd/A) | El light emission center wavelength (nm) |
| --- | --- | --- | --- | --- | --- |
| Example 10 | Polymer compound 2 = 100 | DCBP (160) | Layer corresponding to Example 1 | 4.5 | 450 |
| Example 11 | Polymer compound 2 = 100 | DCBP (160) | Layer corresponding to Example 2 | 4.5 | 450 |
| Example 12 | Polymer compound 2 = 100 | No addition | Layer corresponding to Example 2 | 2.3 | 450 |
| Example 13 | Polymer compound 2 = 100 | DCBP (160) | Layer corresponding to Example 3 | 3.7 | 450 |
| Example 14 | Polymer compound 2 = 100 | DCBP (160) | Layer corresponding to Example 4 | 3.8 | 450 |
| Example 15 | Polymer compound 2 = 100 | DCBP (160) | Layer corresponding to Example 5 | 3.4 | 450 |
| Example 16 | Polymer compound 2 = 100 | DCBP (160) | Layer corresponding to Example 6 | 5.0 | 450 |
| Example 17 | Polymer compound 2 = 100 | DCBP (160) | Layer corresponding to Example 7 | 4.1 | 450 |
| Example 18 | Polymer compound 2 = 100 | DCBP (160) | Layer corresponding to Example 8 | 4.6 | 450 |
| Example 19 | Polymer compound 2 = 100 | DCBP (160) | Layer corresponding to Example 9 | 2.5 | 450 |
| Comparative Example 5 | Polymer compound 2 = 100 | DCBP (160) | PEDOT | 1.1 | 450 |
| Comparative Example 6 | Polymer compound 2 = 100 | No addition | PEDOT | 0.1 | 450 |
| Comparative Example 7 | Polymer compound 2 = 100 | DCBP (160) | Layer corresponding to Comparative Example 4 | 0.9 | 450 |

*4 An addition amount of an additive to 100 parts by weight of the total weight of a polymer compound
*5 DCBP: the following formula, 4,4'-bis(9-carbozoyl)-biphenyl (Dojin Laboratories)

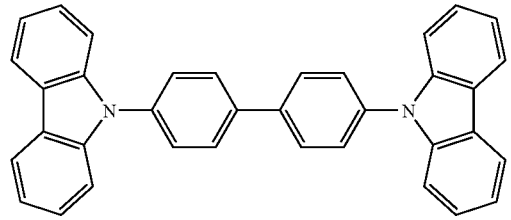

[Formula 16]

therein. Then, the solution was filtered with a Teflon® filter of 0.2 µm in diameter to prepare a coating solution.

The obtained solution was coated as a film on a glass substrate by spin coating. The substrate coated with the film was baked in a nitrogen atmosphere under a baking condition of 300° C./20 min. Thereafter, the baked substrate was washed with toluene; then the thicknesses of the film before and after the toluene rinsing were measured by a film thickness meter of contact probe type (DEKTAK, Veeco Instruments). The toluene rinsing was performed by mounting toluene on the substrate by a spin coater in a state of the toluene rising above the substrate due to its surface tension and then rotating the substrate at 4,000 rpm to throw off the toluene on the substrate. The results are shown in Table 3.

TABLE 3

| | Composition of polymer compound | Kind and addition amount of crosslinking agent (parts by weight *1) | Film thickness before toluene rinsing | Film thickness after toluene rinsing |
|---|---|---|---|---|
| Example 20 | Polymer compound 6 = 100 | DPHA (25 parts) | 40 nm | 30 nm |
| Comparative Example 8 | Polymer compound 6 = 100 | No addition | 40 nm | 0 nm |
| Comparative Example 9 | Polymer compound 6 = 100 | OXT121 (25 parts) | 50 nm | 15 nm |

*1 An addition amount of the crosslinking agent to 100 parts by weight of the total weight of the polymer compound
OXT121: a crosslinking agent represented by the following formula, made by Toagosei Co., Ltd.

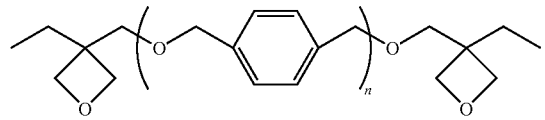

n = 1: 80% to 85%, n = 2: 10% to 15%, n > 3: <5%

Example 23 and Comparative Examples 11 to 12

Fabrication of Hole Injection Layers

The solutions of Example 20 and Comparative Examples 8 and 9 were each coated as a film by spin coating on a glass substrate on which an ITO film had been bonded in a thickness of 150 nm by sputtering. The coated substrate was baked in a nitrogen atmosphere in a baking condition of 300° C./20 min.
<Preparation of a Solution Composition for Light Emission Layers>
1 wt % of the polymer compound 5 was dissolved in toluene. Thereafter, the solution was filtered with a Teflon® filter of 0.2 µm in diameter to prepare a coating solution.
<Evaluation and Fabrication of Devices>
On the fabricated hole injection layer, the prepared polymer light emitter coating solution was coated as a film having a thickness of about 70 nm by spin coating. Further, the coated layer was dried under reduced pressure at 90° C. for 1 h; lithium fluoride was deposited as a cathode buffer by 4 nm; calcium was deposited by 5 nm as a cathode; then, aluminum was deposited by 100 nm to fabricate an organic EL device. The vacuum degree in the every deposition was $1 \times 10^{-5}$ to $9 \times 10^{-5}$ Torr. While a voltage was stepwise applied to the obtained device having a light emission part of 2 mm×2 mm (area of 4 mm$^2$), luminances of EL light emission from the polymer light emitter were measured, and current efficiencies were thereby obtained. The maximum value of the current efficiencies and the center wavelength of EL light emission of the obtained devices are shown in Table 4.

TABLE 4

| | Hole injection layer | Efficiency (cd/A) | Center wavelength of EL light emission |
|---|---|---|---|
| Example 23 | Layer corresponding to Example 20 | 6.6 | 465 nm |
| Comparative Example 11 | Layer corresponding to Comparative Example 8 | 0.02 | 465 nm |
| Comparative Example 12 | Layer corresponding to Comparative Example 9 | 0.02 | 465 nm |

*6 An addition amount of an additive to 100 parts by weight of the total weight of the polymer compound As shown in Table 3, the film obtained by coating the polymer solution composition in the Example are cured by action of heat or light; the dissolution of the film after toluene rinsing are suppressed; thus, the layer structure can be formed by wet coating. Further, as shown in Table 4, as compared with the polymer light emission devices using hole injection layers in the Comparative Examples, the polymer light emission device using a hole injection layer fabricated of the polymer solution composition in the Example exhibits a remarkable improvement in efficiency. The layer using a crosslinking agent having an aromatic ring in its molecule in Comparative Example 9 has a low efficiency as shown in Table 4 though the dissolution of the film after toluene rinsing is suppressed as shown in Table 3.

INDUSTRIAL APPLICABILITY

The polymer composition of the present invention can easily form a layer structure and provide an organic EL device excellent in device performances. The organic EL device fabricated using the polymer composition can be used favorably for apparatuses such as curved or planar light sources as a backlight or illumination of liquid crystal displays, display devices of segment type and flat panel displays of dot matrix.

The invention claimed is:

1. A polymer composition for organic electroluminescence comprising a polymer material as a charge transport material or a light emitter, and a crosslinking agent, characterized in that the crosslinking agent comprises no aromatic ring;

wherein the crosslinking agent is penta- or more functional;

wherein the crosslinking agent is contained in a range of 1 to 99 mass % based on 100 mass % of the polymer material; and wherein the polymer material has a repeating unit derived from an aromatic amine represented by the following chemical formula (2):

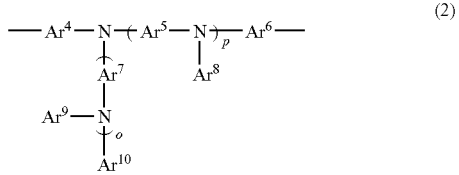

(2)

wherein, $Ar^4$, $Ar^5$, $Ar^6$ and $Ar^7$ each independently denotes an arylene group or a bivalent heterocyclic group; $Ar^8$, $Ar^9$ and $Ar^{10}$ each independently denotes an aryl group or a monovalent heterocyclic group; and o and p each independently denotes 0 or 1, and $0 \leq o+p \leq 2$.

2. The polymer composition according to claim 1, wherein a crosslinking group of the crosslinking agent is at least one selected from the group consisting of a vinyl group, an acetylene group, a butenyl group, an acryl group, an acrylate group, an acrylamide group, a methacryl group, a methacrylate group, a methacrylamide group, a vinyl ether group, a vinylamino group, a silanol group, a cyclopropyl group, a cyclobutyl group, an epoxy group, an oxetane group, a diketene group, an episulfide group, a lactone group and a lactam group.

3. The polymer composition according to claim 1, wherein the crosslinking agent is a (meth)acrylate.

4. The polymer composition according to claim 1, wherein the crosslinking agent is a (meth)acrylate of an aliphatic alcohol.

5. The polymer composition according to claim 1, wherein the crosslinking agent is a penta- or more functional (meth)acrylate.

6. The polymer composition according to claim 1, wherein the crosslinking agent is dipentaerythritol penta(meth)acrylate, dipentaerythritol hexa(meth)acrylate or pentaerythritol octa(meth)acrylate.

7. The polymer composition according to claim 1, wherein the crosslinking agent is dipentaerythritol penta- or hexaacrylate.

8. The polymer composition according to claim 1, wherein the crosslinking agent is dipentaerythritol hexaacrylate.

9. The polymer composition according to claim 1, wherein the polymer material is a conjugated polymer compound.

10. The polymer composition according to claim 1, further comprising a solvent, wherein the polymer composition is in a state of a solution.

11. An organic electroluminescence device, wherein a charge transport layer or a light emission layer is formed of the polymer composition according to claim 1.

12. A planar light source, characterized by using the organic electroluminescence device according to claim 11.

13. A segment display, characterized by using the organic electroluminescence device according to claim 11.

14. A dot matrix display, characterized by using as a backlight the organic electroluminescence device according to claim 11.

15. An organic electroluminescence device, wherein a hole transport layer is formed of the polymer composition according to claim 1.

16. The organic electroluminescence device according to claim 15, characterized by having a structure in which the hole transport layer contacts with an anode.

17. A liquid crystal display, characterized by using as a backlight the organic electroluminescence device according to claim 1.

* * * * *